United States Patent
MacMillan et al.

(10) Patent No.: US 11,486,949 B1
(45) Date of Patent: Nov. 1, 2022

(54) **METHOD AND APPARATUS FOR $T_1$-$T_2^*$ RELAXATION CORRELATION MAGNETIC RESONANCE MEASUREMENT OF MATERIALS**

(71) Applicants: Bryce MacMillan, Oromocto (CA); Bruce Balcom, Fredericton (CA); Razieh Enjilela, Etobicoke (CA); Armin Afrough, Frederiksberg (DK)

(72) Inventors: Bryce MacMillan, Oromocto (CA); Bruce Balcom, Fredericton (CA); Razieh Enjilela, Etobicoke (CA); Armin Afrough, Frederiksberg (DK)

(73) Assignee: University of New Brunswick, Fredericton (CA)

( * ) Notice: Subject to any disclaimer, the term of this patent is extended or adjusted under 35 U.S.C. 154(b) by 0 days.

(21) Appl. No.: 16/983,042

(22) Filed: Aug. 3, 2020

Related U.S. Application Data (60) Provisional application No. 62/881,705, filed on Aug. 1, 2019.

(51) Int. Cl.
  *G01R 33/50* (2006.01)
(52) U.S. Cl.
  CPC .................................. *G01R 33/50* (2013.01)
(58) Field of Classification Search
  CPC ..................................................... G01R 33/50
  See application file for complete search history.

(56) References Cited

U.S. PATENT DOCUMENTS

| | | | | |
|---|---|---|---|---|
| 9,864,033 | B1* | 1/2018 | Marica | G01R 33/4816 |
| 10,473,601 | B1* | 11/2019 | Vashaee | G01N 24/081 |
| 2011/0204892 | A1* | 8/2011 | Li | G01N 24/081 |
| | | | | 324/309 |

OTHER PUBLICATIONS

Camilla et al. "Role of T1 mapping as a complementary tool to T2* for non-invasive cardiac iron overload assessment", PLOS ONE, Feb. 21, 2018 (Year: 2018).*

A.T. Watson, C.T.P. Chang, Characterizing porous media with NMR methods, Prog. Nucl. Magn. Reson. Spectrosc. 31 (1997) 343-386.

(Continued)

*Primary Examiner* — G. M. A Hyder
(74) *Attorney, Agent, or Firm* — Eugene F. Derenyi (57) ABSTRACT

A $T_1$-$T_2^*$ measurement which permits speciation of different components with restricted mobility in samples where a $T_1$-$T_2$ measurement is impossible is disclosed. Tracking the $T_1$-$T_2^*$ coordinate, and associated signal intensity changes, can reveal additional structural and/or dynamic information such as phase changes in rigid/semi-rigid biopolymer samples or pore level changes in morphology of the water environments in cement-based materials. In another aspect, the $T_1$-$T_2^*$ measurement may also be employed to discriminate composition in solid mixtures, a very significant analytical problem in industry. In a further aspect, the $T_1$-$T_2^*$ measurement has particular value in permitting a simple assignment of $T_1$ to different $T_2^*$ populations.

17 Claims, 9 Drawing Sheets

(56) References Cited

OTHER PUBLICATIONS

M.Y. Troutman, I.V. Mastikhin, B.J. Balcom, T.M. Eads, G.R. Ziegler, Moisture migration in soft-panned confections during engrossing and aging as observed by magnetic resonance imaging, J. Food Eng. 48 (2001) 257-26.
B. Macmillan, M. Halse, M. Schneider, L. Fardy, Y.H. Chui, B.J. Balcom, Magnetic Resonance Imaging of rigid polymers at elevated temperatures with SPRITE, Appl. Magn. Reson. 22 (2002) 247-256.
J. Mitchell, M.D. Hurlimann, E.J. Fordham, A rapid measurement of T1/T2: The DECPMG sequence, J. Magn. Reson. 200 (2009) 198-206.
S. Vashaee, M. Li, B. Newling, B. MacMillan, F. Marica, H.T. Kwak, J. Gao, A.M. Al-Harbi, B.J. Balcom, Local T1-T2 distribution measurements in porous media, J. Magn. Reson. 287 (2018) 113-122. doi:10.1016/j.imr.2018.01.001.
Y.Q. Song, L. Venkataramanan, M.D. Hurlimann, M. Flaum, P. Frulla, C. Straley, T1-T2 correlation spectra obtained using a fast two-dimensional Laplace inversion, J. Magn. Reson. 154 (2002) 261-268. doi:10.1006/jmre.2001.2474.
T.C. Chandrasekera, J. Mitchell, E.J. Fordham, L.F. Gladden, M.L. Johns, Rapid encoding of T1 with spectral resolution in n-dimensional relaxation correlations, J. Magn. Reson. 194 (2008) 156-161. doi:10.1016/j.imr.2008.06.008.
M.D. Hurlimann, L. Venkataramanan, Quantitative measurement of two-dimensional distribution functions of diffusion and relaxation in grossly inhomogeneous fields, J. Magn. Reson. 157 (2002) 31-42. doi:10.1006/jmre.2002.2567.
P.J. McDonald, J.P. Korb, J. Mitchell, L. Monteilhet, Surface relaxation and chemical exchange in hydrating cement pastes: A two-dimensional NMR relaxation study, Phys. Rev. E. 72 (2005) 1-9. doi:10.1103/PhysRevE.72.011409.
K.E. Washburn, P.T. Callaghan, Tracking pore to pore exchange using relaxation exchange spectroscopy, Phys. Rev. Lett. 97 (2006) 25-28. doi:10.1103/PhysRevLett.97.175502.
P.T. Callaghan, I. Furo, Diffusion-diffusion correlation and exchange as a signature for local order and dynamics, J. Chem. Phys. 120 (2004) 4032-4038. doi:10.1063/1.1642604.
J. Mitchell, J. Staniland, R. Chassangne, E.J. Fordham, Quantitative in situ enhanced oil recovery monitoring using nuclear magnetic resonance, Transp. Porous Media. 94 (2012) 683-706. doi:10.1007/s11242-012-0019-8.
Y. Song, A 2D NMR method to characterize granular structure of dairy products, Prog. Nucl. Magn. Reson. Spectrosc. 55 (2009) 324-334.
M. Fleury, M. Romero-Sarmiento, Characterization of shales using T1-T2 NMR maps, J. Pet. Sci. Eng. 137 (2016) 55-62. doi:10.1016/j.petrol.2015.11.006.
R. Enjilela, P.F.de J. Cano-Barrita, A. Komar, A.J. Boyd, B.J. Balcom, Wet front penetration with unsteady state wicking in mortar studied by Magnetic Resonance Imaging (MRI), Mater. Struct. 51 (2018). doi:10.1617/s11527-018-1142-y.
L. Venkataramanan, Y. Song, M.D. Hurlimann, Solving Fredholm integrals of the first kind with tensor product structure in 2 and 2.5 dimensions, 50 (2002) 1017-1026.
R. Enjilela, P.F.de J. Cano-Barrita, A. Komar, A.J. Boyd, B.J. Balcom, Monitoring steady state moisture distribution during wick action in mortar by magnetic resonance imaging (MRI), Mater. Struct. 50 (2017) 151-163. doi:10.1617/s11527-017-1017-7.
S.D. Beyea, B.J. Balcom, T.W. Bremner, P.J. Prado, D.P. Green, R.L. Armstrong, P.E. Grattan-Bellew, Magnetic resonance imaging and moisture content profiles of drying concrete, Cem. Concr. Res. 28 (1998) 453-463.
B.J. Balcom, J.C. Barrita, C. Choi, S.D. Beyea, D.J. Goodyear, T.W. Bremner, Single-point magnetic resonance imaging ( MRI ) of cement based materials, Mater. Struct. 36 (2003) 166-182.
J.Y. Jehng, D.T. Sprague, W.P. Halperin, Pore structure of hydrating cement paste by magnetic resonance relaxation analysis and freezing, Magn. Reson. Imaging. 14 (1996) 785-791.
A.C.A. Muller, K.L. Scrivener, A.M. Gajewicz, P.J. McDonald, Densification of C-S-H measured by 1H NMR relaxometry, Phys. Chem. C. 117 (2013) 403-412.
D. Winslow, D. Liu, The pore structure of paste in concrete, Cem. Concr. Res. 20 (1990) 227-235.
N. Fischer, R. Haerdtl, P.J. McDonald, Observation of the redistribution of nanoscale water filled porosity in cement based materials during wetting, Cem. Concr. Res. 68 (2015) 148-155.
C. Hall, W.D. Hoff, S.C. Taylor, M.A. Wilson, B.G. Yoon, H.W. Reinhardt, M. Sosoro, P. Meredith, A.M. Donald, Water anomaly in capillary liquid absorption by cement-based materials, J. Mater. Sci. Lett. 14 (1995) 1178-1181.
S.C. Taylor, W.D. Hoff, M.A. Wilson, K.M. Green, Anomalous water transport properties of Portland and blended cement-based materials, J. Mater. Sci. Lett. 18 (1999) 1925-1927. doi:org/10.1023/A:1006677014070.
A. Valori, P.J. McDonald, K.L. Scrivener, The morphology of C-S-H: Lessons from 1H nuclear magnetic resonance relaxometry, Cem. Concr. Res. 49 (2013) 65-81. doi:10 1016/j.cemconres.2013.03.011.
K.E. Washburn, E. Anderssen, S.J. Vogt, J.D. Seymour, J.E. Birdwell, C.M. Kirkland, S.L. Codd, Simultaneous Gaussian and exponential inversion for improved analysis of shales by NMR relaxometry, J. Magn. Reson. 250 (2015) 7-16. doi:10.1016/j.jmr.2014.10.015.
A.G. Marangoni, B. MacMillan, S. Marty, B.J. Balcom, Spatial mapping of solid and liquid lipid in chocolate, in: M. Guöjónsdóttir, P. Belton, G. Webb (Eds.), Magnetic Resonance in Food Science: Challenges in a Changing World, Royal Society of Chemistry, London, UK, 2009: pp. 105-112.
C. Rondeau-Mouro, R. Kovrlija, E. Van Steenberge, S. Moussaoui, Two dimensional IR-FID-CPMG acquisition and adaptation of a maximum entropy reconstruction, J. Magn. Reson. 265 (2016) 16-24. doi:10.1016/j.imr.2016.01.007.

\* cited by examiner

METHOD AND APPARATUS FOR $T_1$-$T_2$* RELAXATION CORRELATION MAGNETIC RESONANCE MEASUREMENT OF MATERIALS

FIELD

The present disclosure relates in general to the field of magnetic resonance measurement.

BACKGROUND

Magnetic resonance ("MR") is a robust and non-destructive technique for characterizing the structure and dynamics of a wide variety of materials [1-5]. Magnetic resonance/magnetic resonance imaging ("MR/MRI") techniques, in principle, can readily quantify spin populations, discriminate species, and reveal changes in the structure and dynamics of these species.

Multi-dimensional correlation experiments are ubiquitous in MR spectroscopy for studies of molecular structure and dynamics [6]. Relaxation correlation experiments are more recent and include $T_1$-$T_2$ [5,7], $T_2$-$T_1$-$\delta$ [8], D-$T_2$ [9], $T_2$-$T_2$ [10,11], $T_1$-$T_1$-$\delta$ [8], and D-D [12]. $T_1$ and $T_2$ are the longitudinal and transverse relaxation times, respectively, $\delta$ is the chemical shift, and D is the self-diffusion coefficient.

$T_1$ saturation recovery measurements are commonly employed for broad line samples (short $T_2$*) [18]. In addition, the $T_1$-$T_2$ experiment is among the most useful of the relaxation correlation experiments. The $T_1$-$T_2$ correlation experiment can be employed to identify oil and water fractions in reservoir rock core plugs [4]. The relaxation time ratio $T_1/T_2$ of fluids in petroleum reservoir rocks is associated with the strength of the surface interaction between the imbibed liquid and the pore matrix [10,13].

The $T_1$-$T_2$ measurement is commonly employed to discriminate spin populations in samples such as soft biopolymers and fluid bearing reservoir rocks [5,14,15]. However, the $T_1$-$T_2$ spectrum is difficult to acquire in samples with inherently short $T_2$. Examples include many porous materials and large numbers of rigid solid-like materials. In addition, the prior art $T_1$-$T_2$ measurement has a minimum observation time limited by the echo time with subsequent data points acquired at intervals which are multiples of the echo time.

It would be useful for example to provide an alternative to a prior art $T_1$-$T_2$ measurement for systems with short $T_2$ lifetimes.

SUMMARY

In the present disclosure, "$T_1$-$T_2$*" can also be referred to as "$T_1$-$T_2$ star" or "$T_1$-$T_2$*", and "system" and "sample", and "signal amplitude" and "signal intensity", can be used interchangeably.

In one aspect, the present disclosure relates to a magnetic resonance method for measuring relaxation correlation between the $T_1$ time constant, the lifetime describing the recovery of longitudinal magnetization toward equilibrium, and the effective transverse magnetization decay term $T_2$*.

In one aspect, the present disclosure relates to a $T_1$-$T_2$* measurement which permits speciation of different components with restricted mobility in samples where a $T_1$-$T_2$ measurement is impossible or will not yield meaningful results. Tracking the $T_1$-$T_2$* coordinate, and associated signal intensity changes, can reveal additional structural and/or dynamic information such as phase changes in rigid/semi-rigid biopolymer samples or pore level changes in morphology of the water environments in cement-based materials. In another aspect, the $T_1$-$T_2$* measurement may also be employed to discriminate composition in solid mixtures, a very significant analytical problem in industry. In a further aspect, the $T_1$-$T_2$* measurement has particular value in permitting a simple assignment of $T_1$ to different $T_2$* populations.

A $T_1$-$T_2$* measurement according to one aspect of the present disclosure is advantageous for short transverse lifetime samples since the minimum observation time is limited solely by the instrument deadtime with subsequent data points acquired at intervals of the dwell time.

In another aspect, the present disclosure relates to a measurement of a $T_1$-$T_2$* distribution for systems with short $T_2$ lifetimes. In one aspect, the minimum observation time for transverse magnetization in the $T_1$-$T_2$* measurement is the radio frequency ("RF") probe deadtime, and the minimum time resolution for evolving transverse magnetization is the dwell time. These are both dramatically shorter (for example, the difference in time scale can be one to two orders of magnitude) than typically encountered in prior art echo-based $T_1$-$T_2$ measurements.

In another aspect, the present disclosure relates to a method of magnetic resonance measurement of a sample including the steps of (a) applying a pulse sequence for a $T_1$-$T_2$* measurement to the sample, (b) following a selected recovery time τ, acquiring a free induction decay (FID), and sampling the FID at discrete time intervals to yield signal amplitude measurements, and (c) allowing for recovery of the sample to equilibrium and then repeating steps (a) and (b) with another selected recovery time τ in step (b).

BRIEF DESCRIPTION OF THE DRAWINGS

Embodiments of the invention will now be described in relation to the drawings in which.

DETAILED DESCRIPTION $T_1$-$T_2$* Measurement

Figure 1:
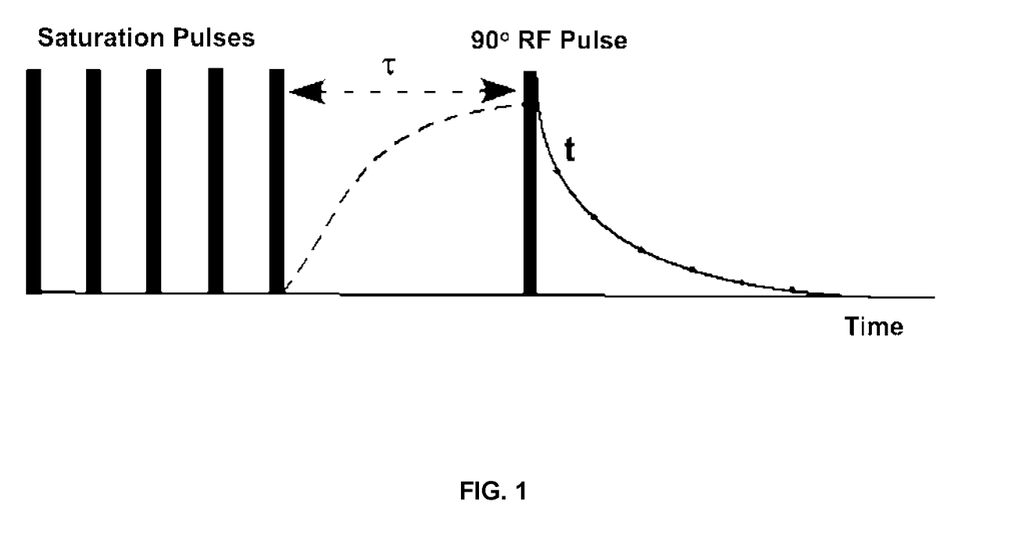
FIG. 1 is a diagram of a pulse sequence for a saturation recovery-FID measurement of $T_1$-$T_2$* according to an embodiment of the present invention.

FIG. 1 shows Mz recovery after saturation with a train of RF pulses in a method according to an embodiment of the present invention. Time τ appears in Eq. 1 (see below) in association with $T_1$ recovery. Time t in Eq. 1 appears in association with time constant $T_2^*$. A complete free induction decay ("FID") is measured over many times t, with each repetition with a different selected τ.

With further reference to FIG. 1, a pulse sequence for a bulk $T_1$-$T_2^*$ measurement according to an embodiment of the present invention is shown which includes "Saturation Pulses" (see the first part of FIG. 1) which are a train of saturation RF pulses which zero the longitudinal magnetization in a sample being measured. After each variable recovery time designated as τ, a FID is collected with data points (shown as ● points on the curve(s) below tin FIGS. 1-4) and a dwell time. A signal is acquired during a FID measurement after a $T_1$ saturation recovery. The resulting signal is described by a 2D Fredholm integral of the first kind [17] according to Eq. 1:

$$S(\tau,t) = \iint dT_1 dT_2^* f(T_1, T_2^*)(1-\exp\{-\tau/T_1\})(\exp{-t/T_2^*}) \quad \text{Eq. (1)}$$

where f ($T_1$, $T_2^*$) is a 2D distribution function for $T_1$ and $T_2^*$, τ is a variable recovery time following saturation. The variable t is the time following the 90° excitation RF pulse. The data analysis relies on inversion of the integral to extract f ($T_1$, $T_2^*$) from the measured signal amplitude.

In FIG. 1, a train of five saturation pulses is shown but other numbers of saturation pulses can be used.

Prior art measurement of $T_1$ with inversion recovery or saturation recovery involves generating a FID at various times τ after inversion. Typically, only the first good point on the FID is kept and all the other data is discarded. In one embodiment, the present inventors have discovered that data that is normally discarded is data that is useful when analyzed according to methods of the present invention.

A method according to one embodiment of the present invention includes the steps of:
(a) applying a series of RF pulses to the sample yielding a longitudinal magnetization Mz of zero value;
(b) during a selected recovery time τ, allowing Mz to recover towards an equilibrium value of Mz=Mo governed by time constant $T_1$;
(c) at a selected time τ, applying a pulse for rotating the instantaneous Mz into the transverse plane, creating observable magnetization;
(d) sampling the observable magnetization in time, t, as the observable magnetization decays toward equilibrium with transverse magnetization Mxy=0, during which the decay time constant is $T_2^*$; and
(e) allowing for recovery of the sample to equilibrium and then repeating steps (a) to (d) with another selected recovery time τ in step (c).

In a still further embodiment, steps (a) to (e) above, can be repeated, such as for signal averaging.

In one embodiment, the number of different τ values selected is less than 50. In another embodiment, the longest τ value should be much greater than the longest anticipated $T_1$. The shortest should be arbitrarily close to zero time. In one embodiment, hundreds or thousands of time domain data points can be sampled during the $T_2^*$ decay. In another embodiment, sampling continues until the observable transverse magnetization decays to 0.

In another embodiment, the steps (a) to (d) above are repeated for signal averaging in order to build up a suitable signal-to-noise of the entire data.

In one embodiment, the data set is signal amplitude (real and imaginary components) as a function of time t, as a function of variable τ.

In another embodiment, for short signal lifetime systems (short $T_2$ and also short $T_2^*$), the minimum observation time for evolving transverse magnetization is the RF probe dead-time (which is very short typically), and subsequent measured points on the FID are separated by the dwell time, which is typically on the order of micro seconds. These two features mean that a method according to an embodiment of the present invention can be applied to short $T_2$, $T_2^*$ systems that are impossible to measure with a conventional $T_1$-$T_2$ measurement.

In another embodiment, the data set S(τ,t), described by Eq. 1, is inverted to determine f($T_1$, $T_2^*$). This inversion process is often known as a two-dimensional inverse Laplace transform. Signal intensity as a function of $T_1$ and $T_2^*$ is the object of the measurement. It permits one to quantitatively determine different signal components, which may correspond to a different sample environment or different sample components.

Eq. 1 assumes that the magnetization evolution is exponential due to $T_1$ and $T_2^*$ (two exponentials appear in Eq. 1). For many solid-like species, the decay is not a simple exponential. It may be Gaussian or it be may be sinc Gaussian. At present in these cases, t is assumed exponential. In another embodiment, the second decay term in Eq. 1 is modified such that it is Gaussian or sinc Gaussian (or some mixture of exponential with these other shapes).

In a method according to another embodiment, a 90 degree RF pulse can be employed in step (c) above to rotate longitudinal magnetization into the transverse plane for observation. In another embodiment, it is not necessary to employ a 90 degree RF pulse in step (c) above to rotate longitudinal magnetization into the transverse plane for observation. A low flip angle pulse alpha may be employed to rotate a portion of the magnetization into the transverse plane. This does not modify Eq. 1, it modifies the signal intensity fin Eq. 1.

Figure 2:
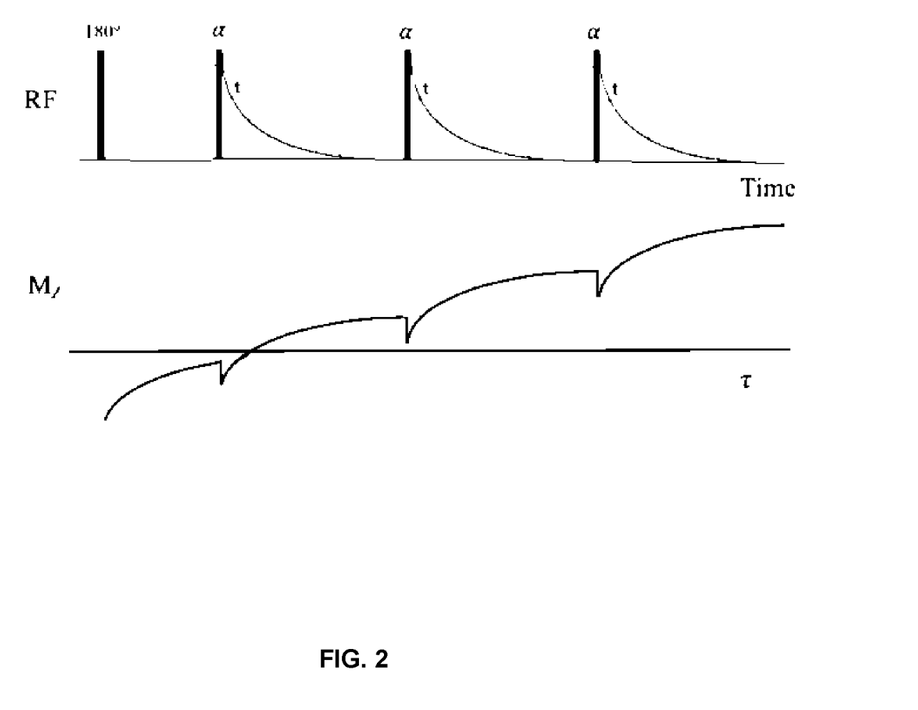
FIG. 2 is a diagram of a pulse sequence or a measurement of $T_1$-$T_2$* according to another embodiment of the present invention.

Referring to FIG. 2, in a further embodiment, the method includes inverting the magnetization and at the commencement of time τ, applying a series of low flip angle RF pulses generating observable transverse magnetization (FIDs that decay with $T_2^*$) at many intervals of τ (only three time intervals are shown in FIG. 2 for convenience of illustration).

Figure 3:
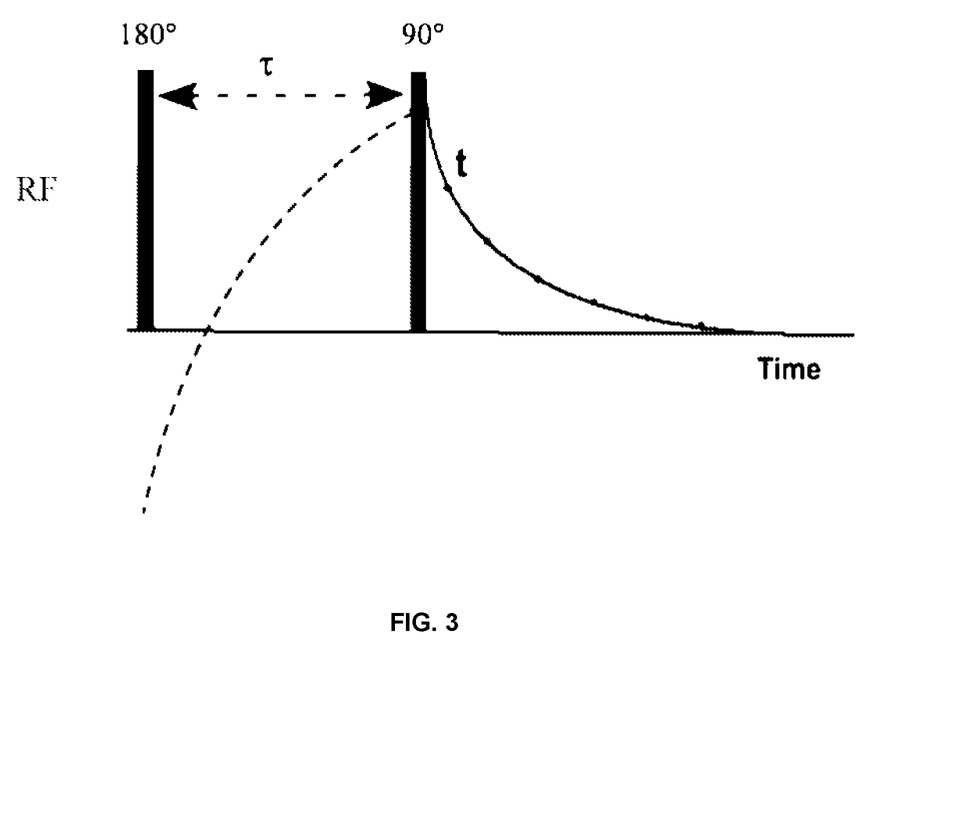
FIG. 3 is a diagram of a pulse sequence for a measurement of $T_1$-$T_2$* according to another embodiment of the present invention.

Referring to FIG. 3., in a method according to another embodiment, instead of saturating the longitudinal magnetization with a series of RF pulses as shown in the first part of FIG. 1, one pulse which is an inversion pulse is applied. This results in Mz=−Mo at the commencement of time τ and a modification of the $T_1$ exponential term in Eq. 1. The dashed line in FIG. 3 shows Mz inverted and then recovering through zero to a positive value as a function of variable τ. The 90 degree pulse generates transverse magnetization that will decay in time t as the FID is measured. However, the same steps as for the embodiment discussed above with respect to FIG. 1 are used in processing the data and f($T_1$, $T_2^*$) is still determined. The longitudinal magnetization at time τ may be rotated into the transverse plane for measurement.

Figure 4:
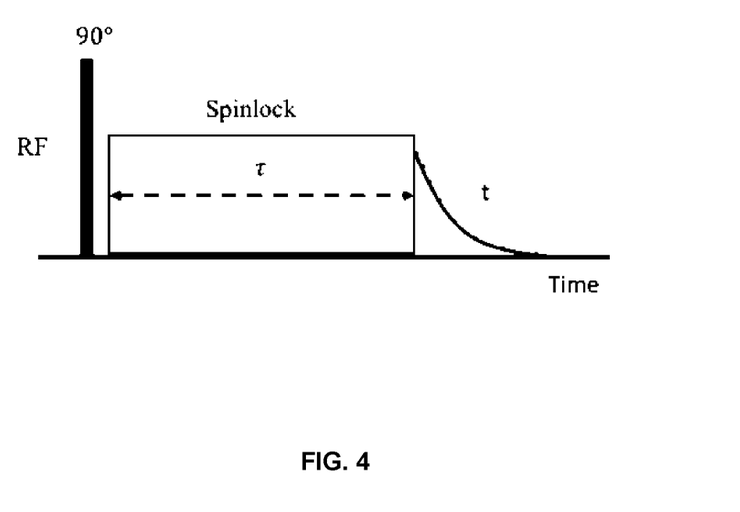
FIG. 4 is a diagram of a pulse sequence for a measurement of Tip-$T_2$* according to another embodiment of the present invention.

Referring to FIG. 4, rather than saturating or inverting Mz as in the first part of FIG. 1, a method according to another embodiment of the present invention includes applying a 90 degree pulse to make all of the sample magnetization transverse. The 90 degree pulse creates transverse magnetization which is then spin-locked by a second pulse, a spin locking RF pulse, which is applied for a variable time τ that changes with each repetition. This results in a decay of sample magnetization that is due to a $T_{1\rho}$ time constant. $T_{1\rho}$ is spin lattice relaxation in the rotating frame. It gives a sensitivity to different time scales of motion. This sensitivity may also be changed through a change in the spin locking frequency. This is achieved through a change in the strength of the spin locking RF field. The full extent of the FID is used to fill in the data matrix for the data set S(τ, t) described above. This makes the measurement much faster.

In one embodiment, the spin lock process is applied for different time durations, τ. After the spinlock field is turned off, the transverse magnetization decays with time constant $T_2^*$. Eq. 1 is then modified to have an exponential decay with time constant $T_{1\rho}$ (not $T_1$). A modified Eq. 1 is used. Instead of the exponential recovery with $T_1$, $[(1-\exp\{-\tau/T_1\})]$, there is an exponential decay with $[T_{1\rho}, [\exp\{-\tau/T_{1\rho}\}]$. The data set is processed according to modified Eq. 1. Note there is no second RF pulse to create transverse magnetization. It is made transverse at the outset.

In other embodiments, rather than wait $5\times T_1$ for full recovery of the spin system between repetitions of the measurement discussed above with respect to FIGS. 1, 3 and 4, a new, presumed identical sample, is inserted for each measurement. In this way, the $5\times T_1$ restriction for solid-like species samples that can be extremely long (for example one minute if the long $T_1$ is 10 seconds), is avoided. It assumes a cohort of identical samples that are all at equilibrium Mz magnetization Mz=Mo.

In an apparatus according to an embodiment of the present invention, a magnet that has an inhomogeneous static $B_o$ field can be used. For short $T_2^*$ species samples (for example solids), the $T_2^*$ lifetimes will often be so short that magnetic field homogeneity is not very important. This expands significantly the range and type of magnets that may be employed for measurements according to the methods of the present invention, as compared to prior art $T_1$-$T_2$ measurements.

In another embodiment, methods according to the present invention can be adapted using the prior art method described in reference [5] to carry out a slice selection. In one embodiment of a slice method, in step (a) above, the series of RF pulses are replaced by an adiabatic pulse causing inversion in a specific region. Rather than generate an echo train after the sampling RF pulse, as magnetization recovers during τ as in prior art local $T_1$-$T_2$ measurements, the FID is collected after the single sampling pulse (the 90 degree pulse in step (c)). The steps are repeated without doing the inversion and the results are subtracted to generate a data set according to Eq. 1 from a specified slice.

In another embodiment, if one has prior sample knowledge of the bounds of sample behaviour in $T_1$-$T_2^*$ space, it is not necessary to acquire the full data matrix of Eq. 1 with inversion of the data set to determine $T_1$-$T_2^*$. If one has such prior knowledge, only a limited subset of the data will need to be acquired to permit the relevant information to be determined. For example, it may be known that species A and B will be present in a sample, and what is of interest is measuring how much of A and how much of B is present in the sample. If the $T_{1A}$ and $T_{2}^*{}_{A}$ is known as well as $T_{1B}$ and $T_{2}^*{}_{B}$, the analysis problem is much simpler and less data is required.

In another embodiment, if it is desired to suppress long $T_1$ signal components, it is not necessary to wait $5\times T_1$ between repetitions of the measurements of steps (a) to (e) above. This suppresses long $T_1$ signal components, simplifying the resulting data set and analysis.

Methods of the present invention can be implemented on standard MR equipment. In one embodiment, a variety of algorithms and programs may be employed to undertake inversion processes used in the present invention.

Experimental

In an experiment, a spin system was saturated by irradiation with a train of RF pulses which reduce the longitudinal magnetization to zero and destroy coherence between the nuclei. Saturation recovery was employed for these measurements although inversion recovery initialization of the spin system followed by a FID is also possible.

A $T_1$-$T_2^*$ measurement of a uniform polyurethane phantom and two mortar samples was carried out using a method according to an embodiment of the present invention. The correlation between $T_1$ and $T_2^*$ lifetimes was investigated to differentiate pore environments in mortar samples. The $T_1$-$T_2^*$ mortar results were compared to previous work [16].

To determine the two-dimensional distribution f($T_1$, $T_2^*$), it was necessary to invert the acquired data by solving the Fredholm equation of the first kind numerically. The $T_1$-$T_2^*$ data sets were inverted using MATLAB code (Schlumberger-Doll Research, Cambridge, Mass., US) to determine the $T_1$-$T_2^*$ correlation.

All MR measurements were performed at 0.05 T with a vertical-bore MARAN DRX spectrometer (Oxford Instruments, Abingdon, UK) at a resonance frequency of 2.2 MHz. A 5.1 cm inner diameter RF probe and a 25 W RF amplifier were employed.

Conventional $T_1$ saturation recovery, $T_2$ CPMG, bulk FID and bulk $T_1$-$T_2^*$ measurements were undertaken on a uniform amber polyurethane phantom (McMaster-Carr, Atlanta, Ga., US). The polyurethane phantom, 5 cm in length and 3.8 cm in diameter, had ideal properties for this study.

MR measurements were also performed on two cylindrical mortar samples at three stages of water absorption. The mortar samples were 4.5 cm in length and 3.8 cm in diameter, with water to cement ratios (w/c) of 0.45 and 0.60. The mortar samples, well cured, were placed in a shallow water bath such that the lower end was submerged approximately 2 cm in the water, while the upper end was in contact with ambient air. The sample exterior was sealed to prevent radial moisture transport. Sample preparation and experimental setup are detailed elsewhere [16,19].

Bulk $T_1$-$T_2^*$ measurement parameters for the mortar samples were as follows: variable recovery times (τ) non-linearly spaced between 0.01-1000 ms over 26 separate acquisitions, 90° RF pulse length=28 μs, number of points on each FID data set=2048, signal averages=16, filter width=1 MHz, RF probe dead time=30 μs, dwell time=1 μs, and filter dead time=6 μs. Saturation was achieved using a comb of fifteen 90° RF pulses with a separation of 100 μs. The repetition delay between successive scans was 1 s for a total measurement time of 7 min.

The $T_1$-$T_2^*$ measurement parameters for the polyurethane sample were the same as for the mortar samples except for an increase in the interval between saturation pulses to 600 μs. The variable recovery times (τ) were non-linearly spaced between 0.05-800 ms over 26 separate acquisitions with a total measurement time of 5.6 min. The first 8 points on the FID, affected by RF coil ringing, were removed prior to any further data processing.

The optimised regularization parameter was found to be 7.5. The regularization parameter was adjusted to balance the residual fitting errors with the known noise amplitude, producing a result that is stable in the presence of noise [7,17].

Results and Discussion

Figure 5:
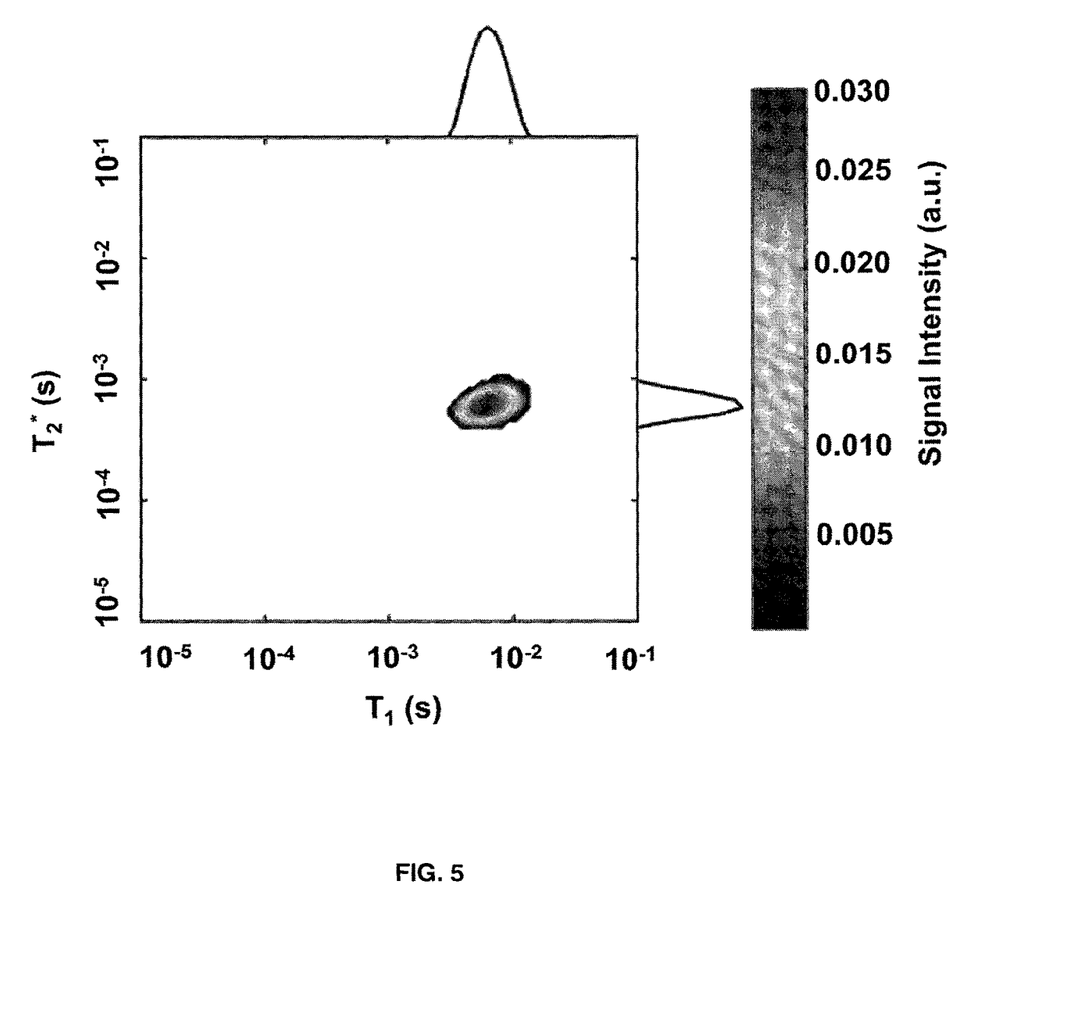
FIG. 5 is a bulk $T_1$-$T_2$* relaxation correlation plot for a polyurethane phantom measured according to the method of FIG. 1.

The bulk $T_1$-$T_2^*$ measurement was undertaken on a polyurethane phantom as a control measurement, see FIG. 5. FIG. 5 is the bulk $T_1$-$T_2^*$ relaxation correlation plot for the polyurethane phantom measured according to the method of FIG. 1. Projections of $f(T_1, T_2^*)$ along the $T_1$ and $T_2^*$ axes are displayed at top and at right. The $T_1$-$T_2^*$ result revealed a single peak with coordinates that match conventional $T_1$ and $T_2^*$ measurements. The color bar (shown in grey scale) indicates the magnitude of the signal intensity in arbitrary units. The $T_1$-$T_2^*$ spectrum revealed a single symmetric peak, $T_{1max}$=6.4 ms and $T_2^*{}_{max}$=0.58 ms. These values in are in good agreement with those measured with separate $T_1$ saturation recovery and FID measurements. The $T_1$-$T_2^*$ phantom measurement was straightforward, but conservative selection of the repetition delay led to a total measurement time of 5.6 min. Considering the short $T_1$ lifetime of the phantom, the measurement time could have been reduced by an order of magnitude. SNR for the raw $T_1$-$T_2^*$ data set was 140. The FID deadtimes in these examples, 30 μsec, are longer than achieved with other permanent magnet based instruments. Higher frequency aids in reduction of the probe deadtime.

The phantom measurement revealed the precision of the $T_1$-$T_2^*$ approach. To test the utility of the $T_1$-$T_2^*$ measurement in a porous media sample, the $T_1$-$T_2^*$ experiment was undertaken on two mortar samples (w/c=0.45, and 0.60) during three stages of water absorption. These samples have very short $T_2$ lifetimes. Characterization with $T_1$-$T_2$ measurement was impossible. In these dynamic samples, the $T_2^*$ lifetime varies during unsteady state water absorption [16]. Changes in the $T_1$-$T_2^*$ spectrum were anticipated during water uptake. The water absorption process is a combination of capillary absorption and water vapor diffusion with evaporation at the surface in contact with ambient air [20].

Figure 6A:
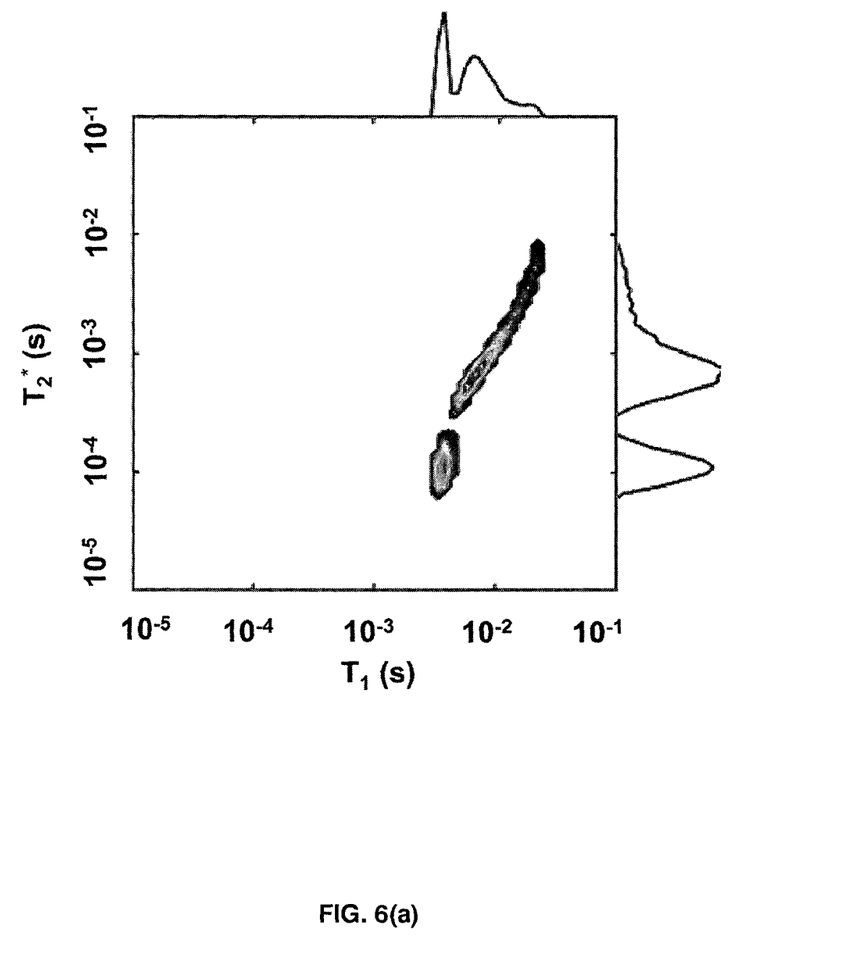
FIG. 6(a) is a bulk $T_1$-$T_2$* relaxation correlation plot for a 0.45 w/c ratio mortar sample after 8 hrs.

FIG. 6(a) shows the $T_1$-$T_2^*$ spectrum for a partially water saturated mortar sample, w/c=0.45, after 8 hrs of water absorption. Two peaks are observed. The first peak with symmetric shape has well defined coordinates centered on $T_{1max}$=3.7 ms and $T_2^*{}_{max}$=0.11 ms. This peak was assigned to interlayer water (water between C—S—H layers). The second peak has a distribution of $T_1$ and $T_2^*$ lifetimes with a tail extending to longer relaxation times. However, the distribution is dominated by relaxation times centered on $T_{1max}$=8.2 ms and $T_2^*{}_{max}$=0.90 ms. This peak was assigned to water in the pore space. The $T_{1max}$ and $T_2^*{}_{max}$ values are in good agreement with those measured with separate $T_1$ saturation recovery and FID measurements, but these measurements do not reveal the distribution observed in the $T_1$-$T_2^*$ measurements. The SNR for the raw time domain $T_1$-$T_2^*$ data was 30.

The presence of two peaks is a strong indication that there are at least two distinct water populations in this sample. Projections of $f(T_1, T_2^*)$ along the $T_1$ and $T_2^*$ axes, at top and at right of FIG. 6(a), show a distribution of $T_1$ and $T_2^*$ due to different molecular environments. Although the peaks are discriminated in both the $T_1$ and $T_2^*$ dimensions, differentiation of water populations is easier in the $T_2^*$ dimension.

In cement based-materials, the $T_2^*$ lifetimes are substantially shorter [21,22] than those observed in many other fluid bearing porous media. The $T_2$ of interlayer water, and hence the $T_2^*$, is short due to restricted mobility of water in the C—S—H interlayer space [23,24]. The $T_2^*$ of pore water is associated with a short $T_2$ due to surface relaxation and field inhomogeneity effects due to the susceptibility difference between the solid matrix and pore fluid. Although measurements were undertaken at a low static magnetic field, susceptibility contrast still affects the $T_2^*$ lifetime in the mortar samples. Cement based-materials contain a distribution of pore sizes [25], thus $T_2$ is expected to be multi-modal. By analogy to typical petroleum reservoir core plugs susceptibility contrast effects reduce $T_2^*$ from the $T_2$ value. A dominant $T_2^*$ value is observed in the distribution of $T_2^*$ values for pore water in FIG. 6(a). This agrees with the literature observation [16,19] that the pore water may be fit by a single exponential $T_2^*$.

Integration of the peaks in FIG. 6(a) permits one to determine the fraction of water in the two environments. The interlayer water fraction was 0.35 while the pore water fraction was 0.65 for the 0.45 w/c ratio mortar sample having undergone 8 hrs of imbibition.

Figure 6B:
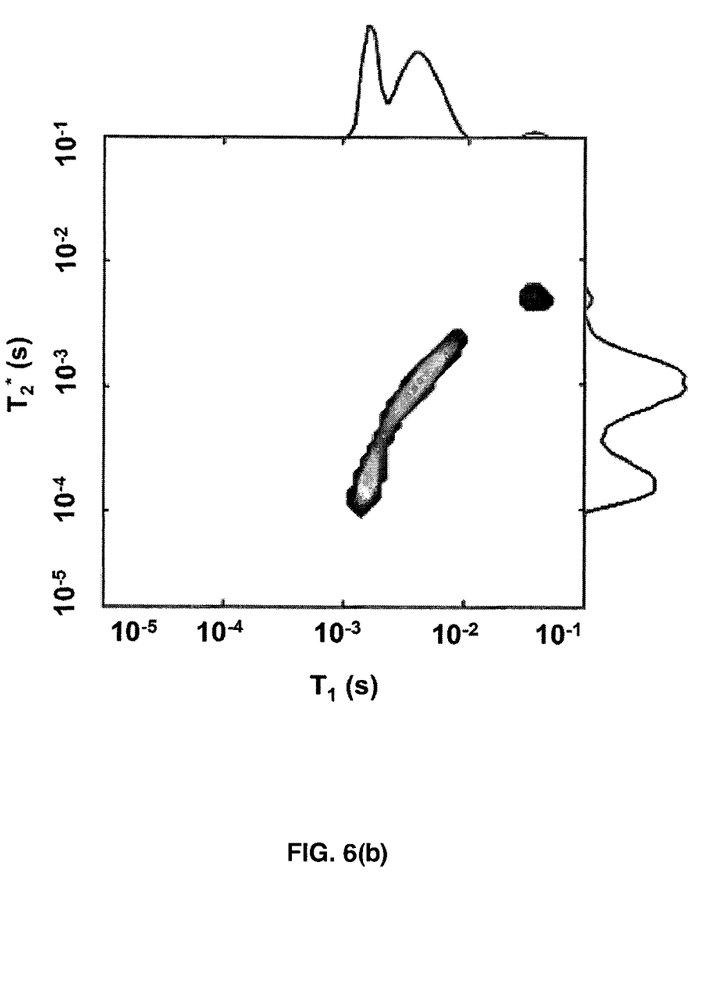
FIG. 6(b) is a bulk $T_1$-$T_2$* relaxation correlation plot for the same 0.45 w/c ratio mortar sample as for FIG. 6(a) after 22 hrs.

FIG. 6(b) shows a $T_1$-$T_2^*$ spectrum for the same mortar sample after 22 hrs of water absorption. Two dominant peaks are once more observed. The first peak centered on $T_{1max}$=1.6 ms and $T_2^*{}_{max}$=0.13 ms, corresponds to interlayer water. The second peak, due to pore water, is again distributed in the $T_1$ and $T_2^*$ dimensions with longer $T_1$ being associated with longer $T_2^*$. The dominant component of the second peak is centred on $T_{1max}$=4.0 ms and $T_2^*{}_{max}$=0.80 ms. Once again, the $T_{1max}$ and $T_2^*{}_{max}$ values in FIG. 6(b) are in good agreement with those measured with separate $T_1$ saturation recovery and FID measurements. There is a minor peak observed in FIG. 6(b) with longer relaxation lifetimes, $T_{1max}$=39 ms and $T_2^*{}_{max}$=4.2 ms. This peak is low intensity and is not considered further. The SNR for the raw $T_1$-$T_2^*$ data set was 34.

In both FIGS. 6(a) and 6(b) it is easier to differentiate the water populations in the $T_2^*$ dimension. Comparison of FIGS. 6(a) and 6(b) shows that $T_1$ decreases for interlayer water while $T_2^*$ remains quasi constant from 8 hrs to 22 hrs of water absorption. For the pore water peak both $T_1$ and $T_2^*$ shift to shorter lifetimes. The interlayer water was 0.35 of the total water observed while the pore water was 0.64. There is no significant difference in relative populations from the 8 hrs imbibition result of FIG. 6(a).

Figure 6C:
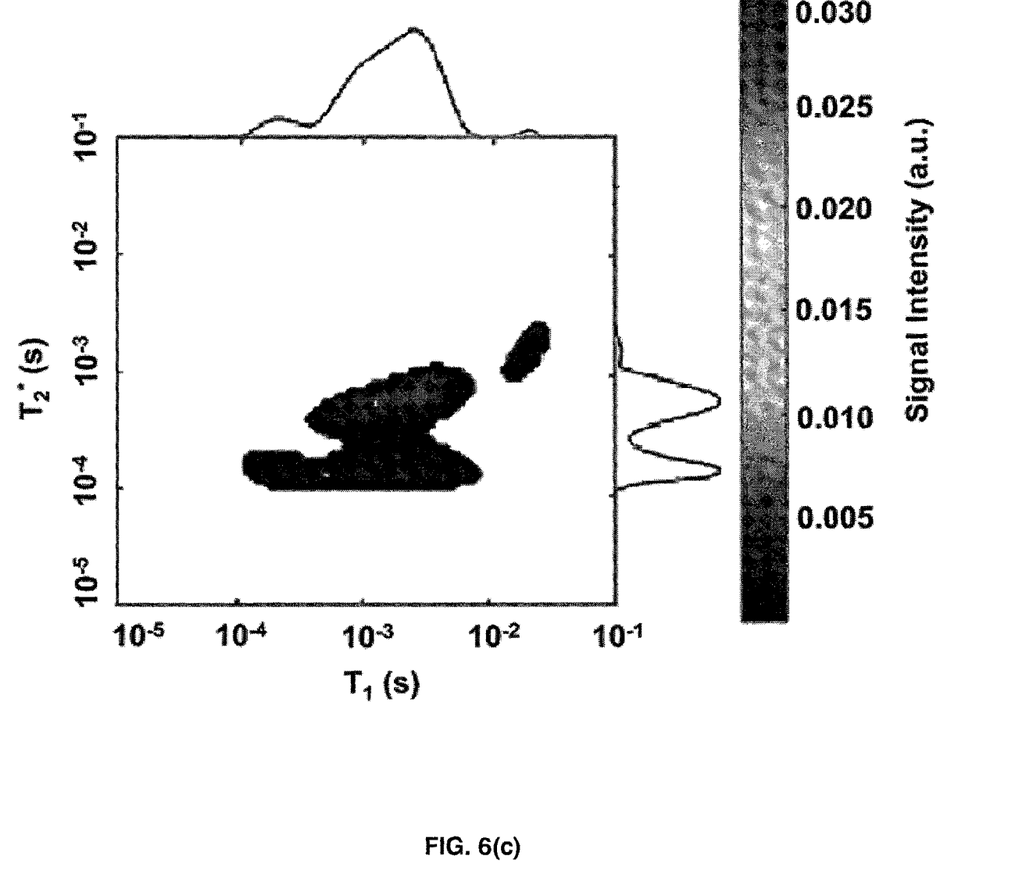
FIG. 6(c) is a bulk $T_1$-$T_2$* relaxation correlation plot for the same 0.45 w/c ratio mortar sample as for FIG. 6(a) after 135 hrs.

FIG. 6(c) shows the $T_1$-$T_2^*$ spectrum after 135 hrs of water absorption. Once more two dominant peaks are observed. The shape and distribution of the peaks, corresponding to interlayer water and water in the pore space, have changed dramatically from earlier imbibition times. The pore water peak has shifted towards the interlayer water peak and they partially overlap. The interlayer water peak is significantly elongated in the $T_1$ dimension. The interlayer water and pore water peaks are centered on $T_{1max}$=1.0 ms, $T_2^*{}_{max}$=0.14 ms and $T_{1max}$=1.6 ms, $T_2^*{}_{max}$=0.56 ms, respectively. Discrimination of the water populations is no longer possible in the $T_1$ dimension. Discrimination of the water populations is still possible in the $T_2^*$ dimension despite partial overlap of the peaks. The $T_1$ and $T_2^*$ both shift to shorter relaxation lifetimes in the pore water peak. The integrated signal from the two peaks in FIG. 6(c) shows that interlayer water was 0.35 of the total signal. The pore water peak was 0.61 of the total signal. Once again there is a minor peak in the spectrum which accounts for the remaining signal. SNR for the raw $T_1$-$T_2^*$ data was 40.

Figure 7:
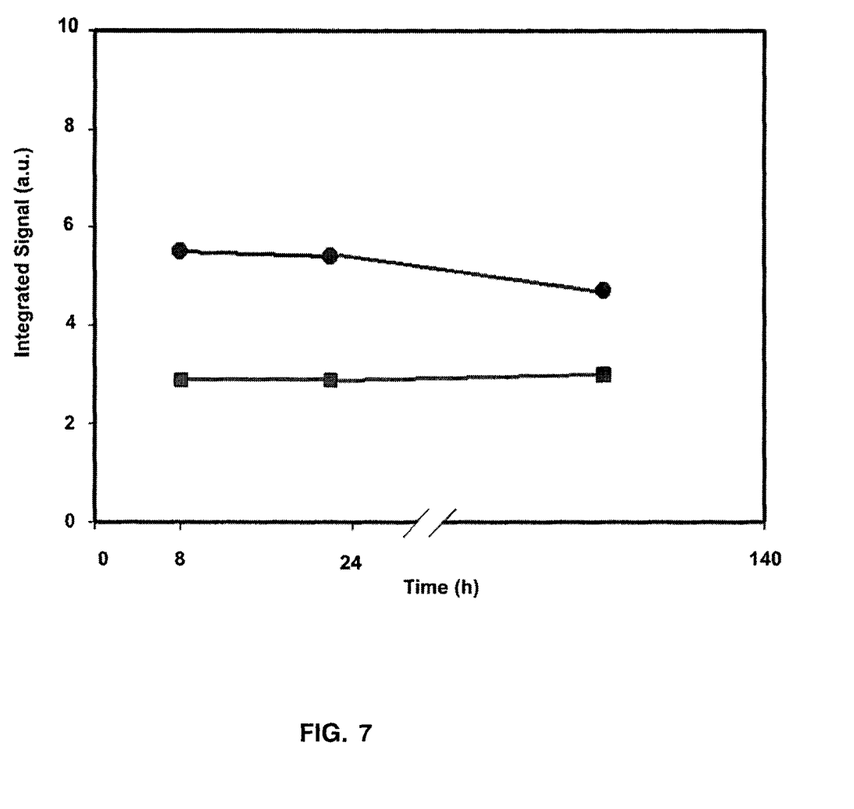
FIG. 7 are graphs of (i) integrated signal from interlayer water (■) and (ii) pore water (●) peaks versus the imbibition time.

FIG. 7 plots the integrated signal of the interlayer water and pore water peaks versus water imbibition time. The dominant peaks are attributed to interlayer water and water in the pore space. Projections of $f(T_1, T_2^*)$ along the $T_1$ and $T_2^*$ axes are displayed at top and at right. The color bar (shown in grey scale) indicates the magnitude of the signal intensity in arbitrary units. The discrimination of different water populations is easier in the $T_2^*$ dimension. The integrated interlayer water signal does not change significantly with water imbibition time. The integrated pore water signal decreases slightly. The water environment changes significantly as revealed in FIG. 6(c). In previous work [16], it was shown that the shorter $T_2^*$ lifetime, and associated signal intensity, corresponding to interlayer water, remained constant during water absorption for a w/c=0.45 mortar sample. Interlayer water is tightly held in the cement paste structure [26]. Therefore, it does not contribute to water transport. The integrated signal of the pore water peak decreases slightly. This is a surprising result because the present inventors know that 0.6 grams of water has entered the sample between the 22 hrs and 135 hrs measurements. Fischer et al. [27] observed similar behavior in related samples. In their study the signal intensity associated with larger pores decreased after 24 hrs of imbibition, despite constant/increasing mass for the concrete samples under study. The 0.6 gram increase in water content between 22 hrs and 135 hrs of imbibition is a tangible increase but not a significant increase in water content compared to the pre-existing water content in the pore space and interlayer water environments of 8 grams. These water contents were estimated based on calibration of the MR signal and by calculation based on sample composition.

The most notable feature of FIGS. 6(a) to (c) is the dramatic change in the shape and position of the interlayer water and pore water peaks. The change is most pronounced comparing FIGS. 6(b) and 6(c). The drastic change observed suggests a significant pore level morphology change of both the interlayer water and water in the pore space. A substantial shift of the pore water peak to shorter $T_1$ and shorter $T_2^*$ is consistent with a shift in water environment toward smaller and more confined water environments. The dramatic change in the $T_1$-$T_2^*$ plot between 22 hrs and 135 hrs of water imbibition is coincident with dramatic changes in macroscopic water absorption observed by many investigators [27,28] in similar mortar samples, as revealed in FIG. 7. The dramatic change in sorptivity (water absorption rate) in FIG. 7 must be associated with pore level changes in water behavior.

Figure 8:
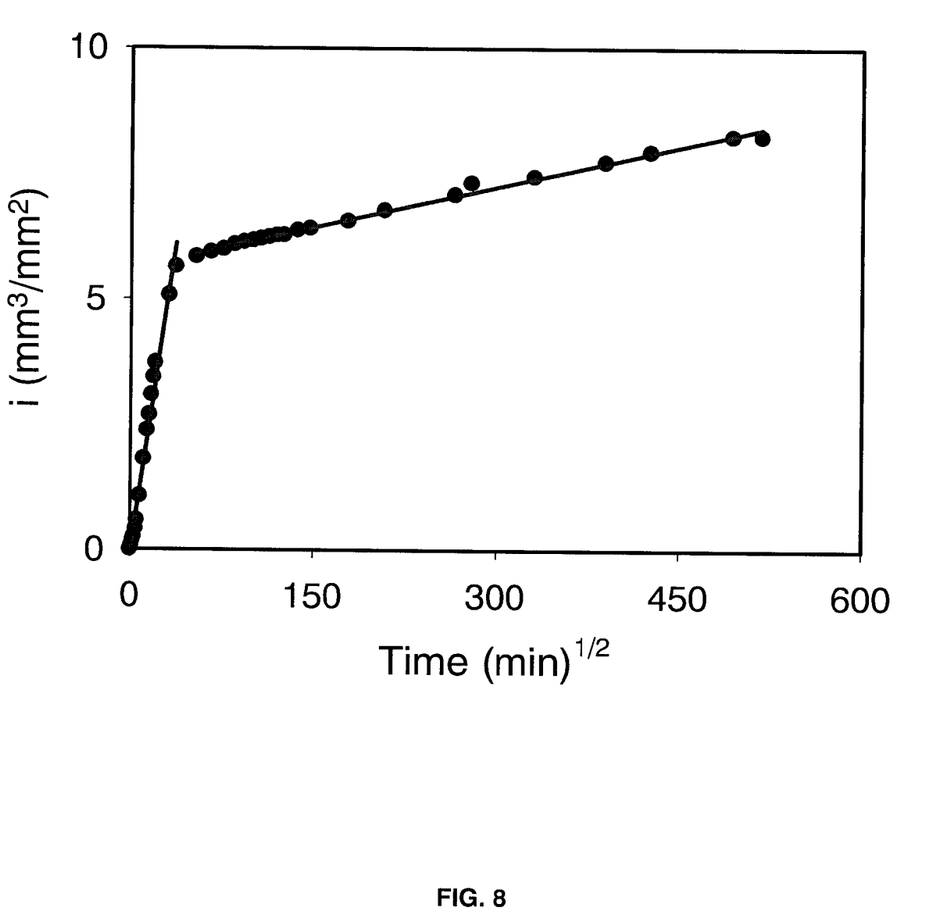
FIG. 8 is a graph of cumulative water absorbed per unit area versus square root of elapsed time for a duplicate mortar sample (w/c=0.45) subject to water absorption.

FIG. 8 was adapted from reference [16] for a duplicate mortar sample (w/c=0.45) with an identical imbibition experiment. The absorption behavior is characterized by a prominent breakpoint (FIG. 8). The rate of water uptake is substantially different before and after the breakpoint. The breakpoint time in FIG. 8 is approximately 48 hrs [16]. The water absorption times of 22 hrs and 135 hrs of FIGS. 6(b) and 6(c) were chosen to bracket the breakpoint time for a 0.45 w/c ratio mortar.

Taylor et al. [29] reported that low density C—S—H swelling, associated with hydration and rehydration of unreacted and dehydrated components of the hardened cement paste, contributed to the water absorption anomaly. The ingress of water acts against cohesive forces and tends to separate the C—S—H sheets, with a resultant swelling pressure. A shrinkage of the pore space is suggested by a decrease in $T_2^*$ [28,29]. Fischer et al. [27] also stated that C—S—H gel swelling is the reason for a decrease in the signal intensity of water in larger pores after a swelling time of 24 hrs. A decrease in $T_1$ of water in the pore space is also consistent with an evolution to smaller pores during swelling [30].

Hall et al. [28] have proposed an alternate explanation for the breakpoint in water absorption. They propose that when mortar samples are exposed to water, new hydration products and swelling of the C—S—H layers block critical pore throats and reduce the pore connectivity. These microstructural changes would also result in a decrease in the water absorption rate and a decrease in the pore water $T_1$ and $T_2^*$ lifetimes. A slight decrease in the integrated signal of the pore water, FIG. 7, could be consistent with water consumption by hydration of unreacted material. Irrespective of the mechanistic interpretation of the breakpoint observation, the results of FIGS. 6(b)-(c) show a very significant disruption of the behavior of the interlayer water signal and pore water signal.

One important feature of the $T_1$-$T_2^*$ measurement is the possibility in certain embodiments of assigning $T_1$ to different $T_2^*$ populations. In FIGS. 6(a), 3(b), and 3(c) the peaks with short $T_2^*$ were assigned to interlayer water. The $T_1$-$T_2^*$ spectrum shows that interlayer water also has a short $T_1$. Although the pore water peak is distributed in the $T_1$ and $T_2^*$ dimensions, the longer $T_1$ component is associated with a long $T_2^*$ component.

The $T_1$-$T_2^*$ spectrum provides a correlation between $T_1$ and $T_2^*$ and permits better observation and interpretation of changes in the sample through changes in the observed peaks. In conventional bulk relaxation time measurements, all information is reduced to one dimension. 2D MR relaxation time measurements improve the discrimination of different spin populations because there are two contrast parameters rather than one. Evolution in the $T_1$-$T_2^*$ spectrum as the sample changes provides much richer information to assist in interpreting sample change compared to conventional measurements. Change in the $T_1$-$T_2^*$ spectrum of the 0.45 w/c ratio mortar as water imbibed was much more readily interpreted than changes in the conventional relaxation times [16].

The $T_1$-$T_2^*$ measurement time for the 0.45 w/c ratio mortar sample was undertaken with a repetition delay of 1 s. This was a very conservative delay which led to a total measurement time of 7 min. A shorter repetition delay, e.g. 60-80 ms, would reduce the measurement time by one order of magnitude.

Analogous $T_1$-$T_2^*$ measurements were undertaken for a w/c=0.60 mortar sample. The $T_1$-$T_2^*$ results exhibited a behavior similar to that of the 0.45 w/c mortar sample (results not shown). The 0.60 w/c ratio mortar sample has a higher porosity with larger pores. The relative quantity of interlayer water is less in this sample compared to the 0.45 w/c ratio mortar [19]. Pore level changes in this sample happened more rapidly than in the 0.45 w/c mortar sample. Substantial pore level changes in morphology of the water environments generally commence at the break point.

Companion centric scan SPRITE MRI measurements show clearly that little water penetration occurs between 22 hrs and 135 hrs, but significant signal is lost from the region of the mortar that is already wet. This agrees with the $T_1$-$T_2^*$ observation that the $T_2^*$ of pore water decreases between 22 hrs and 135 hrs.

In other embodiment, $T_1$-$T_2^*$ information is advantageous for selection of imaging parameters in FID based MRI measurement such as Centric Scan SPRITE and Single Point Imaging (SPI). Bulk $T_1$-$T_2^*$ measurement generates information from the entire sample. The $T_1$-$T_2^*$ measurement may be spatially resolved by analogy to the work of Vashaee et al. [5] where adiabatic inversion pulses were employed.

In further embodiments, the ability of the $T_1$-$T_2^*$ measurement to observe changes in sample structure may be extended to a wide range of short transverse lifetime samples. In the case of mortar samples the $T_2^*$ decay was exponential. In other samples the decay observed may be more solid like Gaussian [31] or Sinc Gaussian [32]. In such cases it will be more appropriate to modify the equation for the Fredholm integral of the first kind to account for non-exponential decay. This has been undertaken [31] with bulk $T_2$ measurements of shale samples.

In still further embodiments, the $T_1$-$T_2^*$ measurement may be logically extended to $T_{1\rho}$-$T_2^*$ through substitution of a spin lock preparation for the $T_1$ preparation. This modification sensitizes the experiment to motion at kHz frequencies rather than MHz frequencies. This aids differentiation of solid like materials. In other embodiments the $T_1$-$T_2^*$ measurement can be used to determine the composition of solid mixtures, for example powders. The presence of adsorbed liquids, such as water, may be readily discriminated through lifetime behaviour. Examples include plant materials such as marijuana. Additional embodiments include detection and quantification of mobile and immobile 1H containing species in solid polymers and elastomers. In other embodiments, $T_1$-$T_2^*$ measurement can be applied to systems which have a mix of solid and liquid signal components, such as shales and coals.

REFERENCES

[1] A. T. Watson, C. T. P. Chang, Characterizing porous media with NMR methods, Prog. Nucl. Magn. Reson. Spectrosc. 31 (1997) 343-386.

[2] M. Y. Troutman, I. V. Mastikhin, B. J. Balcom, T. M. Eads, G. R. Ziegler, Moisture migration in soft-panned confections during engrossing and aging as observed by magnetic resonance imaging, J. Food Eng. 48 (2001) 257-267.

[3] B. MacMillan, M. Halse, M. Schneider, L. Fardy, Y. H. Chui, B. J. Balcom, Magnetic Resonance Imaging of rigid polymers at elevated temperatures with SPRITE, Appl. Magn. Reson. 22 (2002) 247-256.

[4] J. Mitchell, M. D. Hürlimann, E. J. Fordham, A rapid measurement of $T_1/T_2$: The DECPMG sequence, J. Magn. Reson. 200 (2009) 198-206. doi:10.1016/j.jmr.2009.07.002.

[5] S. Vashaee, M. Li, B. Newling, B. MacMillan, F. Marica, H. T. Kwak, J. Gao, A. M. Al-harbi, B. J. Balcom, Local $T_1$-$T_2$ distribution measurements in porous media, J. Magn. Reson. 287 (2018) 113-122. doi:10.1016/j.jmr.2018.01.001.

[6] R. R. Ernst, G. Bodenhausen, A. Wokaun, Principles of nuclear magnetic resonance in one and two dimensions, Oxford University Press, New York, US, 1994.

[7] Y. Q. Song, L. Venkataramanan, M. D. Hürlimann, M. Flaum, P. Frulla, C. Straley, $T_1$-$T_2$ correlation spectra obtained using a fast two-dimensional Laplace inversion, J. Magn. Reson. 154 (2002) 261-268. doi:10.1006/jmre.2001.2474.

[8] T. C. Chandrasekera, J. Mitchell, E. J. Fordham, L. F. Gladden, M. L. Johns, Rapid encoding of $T_1$ with spectral resolution in n-dimensional relaxation correlations, J. Magn. Reson. 194 (2008) 156-161. doi:10.1016/j.jmr.2008.06.008.

[9] M. D. Hürlimann, L. Venkataramanan, Quantitative measurement of two-dimensional distribution functions of diffusion and relaxation in grossly inhomogeneous fields, J. Magn. Reson. 157 (2002) 31-42. doi:10.1006/jmre.2002.2567.

[10] P. J. McDonald, J. P. Korb, J. Mitchell, L. Monteilhet, Surface relaxation and chemical exchange in hydrating cement pastes: A two-dimensional NMR relaxation study, Phys. Rev. E. 72 (2005) 1-9. doi:10.1103/PhysRevE.72.011409.

[11] K. E. Washburn, P. T. Callaghan, Tracking pore to pore exchange using relaxation exchange spectroscopy, Phys. Rev. Lett. 97 (2006) 25-28. doi:10.1103/PhysRevLett.97.175502.

[12] P. T. Callaghan, I. Furó, Diffusion-diffusion correlation and exchange as a signature for local order and dynamics, J. Chem. Phys. 120 (2004) 4032-4038. doi:10.1063/1.1642604.

[13] J. Mitchell, J. Staniland, R. Chassagne, E. J. Fordham, Quantitative in situ enhanced oil recovery monitoring using nuclear magnetic resonance, Transp. Porous Media. 94 (2012) 683-706. doi:10.1007/s11242-012-0019-8.

[14] Y. Song, A 2D NMR method to characterize granular structure of dairy products, Prog. Nucl. Magn. Reson. Spectrosc. 55 (2009) 324-334. doi:10.1016/j.pnmrs.2009.07.001.

[15] M. Fleury, M. Romero-Sarmiento, Characterization of shales using $T_1$-$T_2$ NMR maps, J. Pet. Sci. Eng. 137 (2016) 55-62. doi:10.1016/j.petrol.2015.11.006.

[16] R. Enjilela, P. F. de J. Cano-Barrita, A. Komar, A. J. Boyd, B. J. Balcom, Wet front penetration with unsteady state wicking in mortar studied by Magnetic Resonance Imaging (MRI), Mater. Struct. 51 (2018). doi:10.1617/s11527-018-1142-y.

[17] L. Venkataramanan, Y. Song, M. D. Hürlimann, Solving Fredholm integrals of the first kind with tensor product structure in 2 and 2.5 dimensions, 50 (2002) 1017-1026.

[18] E. Fukushima, S. B. W. Roeder, Experimental pulse NMR: A nuts and bolts approach, Addison-Wesley Publishing, Reading, Mass., US, 1981.

[19] R. Enjilela, P. de J. Cano-Barrita, A. Komar, A. J. Boyd, B. J. Balcom, Monitoring steady state moisture distribution during wick action in mortar by magnetic resonance imaging (MRI), Mater. Struct. 50 (2017) 151-163. doi:10.1617/s11527-017-1017-7.

[20] C. Hall, W. D. Hoff, Water transport in brick, stone and concrete, 1st ed, Spon Press, London, U K, 2002.

[21] S. D. Beyea, B. J. Balcom, T. W. Bremner, P. J. Prado, D. P. Green, R. L. Armstrong, P. E. Grattan-Bellew, Magnetic resonance imaging and moisture content profiles of drying concrete, Cem. Concr. Res. 28 (1998) 453-463.

[22] B. J. Balcom, J. C. Barrita, C. Choi, S. D. Beyea, D. J. Goodyear, T. W. Bremner, Single-point magnetic resonance imaging (MRI) of cement based materials, Mater. Struct. 36 (2003) 166-182.

[23] J. Y. Jehng, D. T. Sprague, W. P. Halperin, Pore structure of hydrating cement paste by magnetic resonance relaxation analysis and freezing, Magn. Reson. Imaging. 14 (1996) 785-791.

[24] A. C. A. Muller, K. L. Scrivener, A. M. Gajewicz, P. J. McDonald, Densification of C—S—H measured by $^1$H NMR relaxometry, Phys. Chem. C. 117 (2013) 403-412.

[25] D. Winslow, D. Liu, The pore structure of paste in concrete, Cem. Concr. Res. 20 (1990) 227-235.

[26] A. M. Neville, Properties of concrete, 4th ed., Longman Group, Harlow Essex, England, 1995.

[27] N. Fischer, R. Haerdtl, P. J. McDonald, Observation of the redistribution of nanoscale water filled porosity in cement based materials during wetting, Cem. Concr. Res. 68 (2015) 148-155.

[28] C. Hall, W. D. Hoff, S. C. Taylor, M. A. Wilson, B. G. Yoon, H. W. Reinhardt, M. Sosoro, P. Meredith, A. M.

Donald, Water anomaly in capillary liquid absorption by cement-based materials, J. Mater. Sci. Lett. 14 (1995) 1178-1181.

[29] S. C. Taylor, W. D. Hoff, M. A. Wilson, K. M. Green, Anomalous water transport properties of Portland and blended cement-based materials, J. Mater. Sci. Lett. 18 (1999) 1925-1927. doi:org/10.1023/A:1006677014070.

[30] A. Valori, P. J. McDonald, K. L. Scrivener, The morphology of C—S—H: Lessons from $^1$H nuclear magnetic resonance relaxometry, Cem. Concr. Res. 49 (2013) 65-81. doi:10.1016/j.cemconres.2013.03.011.

[31] K. E. Washburn, E. Anderssen, S. J. Vogt, J. D. Seymour, J. E. Birdwell, C. M. Kirkland, S. L. Codd, Simultaneous Gaussian and exponential inversion for improved analysis of shales by NMR relaxometry, J. Magn. Reson. 250 (2015) 7-16. doi:10.1016/j.jmr.2014.10.015.

[32] A. G. Marangoni, B. MacMillan, S. Marty, B. J. Balcom, Spatial mapping of solid and liquid lipid in chocolate, in: M. Gudjónsdóttir, P. Belton, G. Webb (Eds.), Magnetic Resonance in Food Science: Challenges in a Changing World, Royal Society of Chemistry, London, U K, 2009: pp. 105-112.

We claim:

1. A method of magnetic resonance measurement of a sample comprising the steps of:
    (a) applying a series of RF pulses to the sample yielding a longitudinal magnetization Mz of zero value;
    (b) during a selected recovery time τ, allowing Mz to recover towards an equilibrium value of Mz=Mo governed by time constant T1;
    (c) at the selected recovery time τ, applying a pulse for rotating the instantaneous Mz into a transverse plane, creating observable magnetization;
    (d) sampling, at discrete time intervals, the observable magnetization in a time t following the pulse for rotating the instantaneous Mz, to acquire signal amplitude measurements as the observable magnetization decays toward equilibrium with transverse magnetization Mxy=O, during which the decay time constant is T2*;
    (e) allowing for recovery of the sample to equilibrium and then repeating, a finite number of times, steps (a) to (d) with another selected recovery time τ, in step (c); and
    (f) processing the signal amplitude measurements for use in determining structure or components of the sample.

2. The method of claim 1, wherein the discrete time intervals are separated by a dwell time.

3. The method of claim 1, wherein processing the signal amplitude measurements comprises inverting the signal amplitude measurements comprising performance of a two-dimensional inverse Laplace transform to obtain signal amplitude as a function of $T_1$ and $T_2$*, for use in determining the structure or components of the sample based on an analysis of the signal amplitude.

4. The method of claim 3, wherein step (c), the applied pulse for rotating the instantaneous Mz into the transverse plane comprises a 90 degree RF pulse.

5. The method of claim 3, wherein step (c), the applied pulse for rotating the instantaneous Mz into the transverse plane comprises a low flip angle pulse.

6. The method of claim 3, wherein the acquired signal amplitude is described according to the equation:

$$S(\tau,t)=\iint dT_1 dT_2 * f(T_1,T_2*)(1-\exp\{-\tau/T_1\})(\exp-t/T_2*)$$

where f ($T_1$, $T_2$*) is a 2D distribution function for $T_1$ and $T_2$*, τ is a variable recovery time following saturation and t is the time following the applied pulse for rotating the instantaneous Mz into the transverse plane.

7. The method of claim 6, wherein the exponential decay term in the equation of claim 6 is modified such that it is Gaussian or sinc Gaussian.

8. The method of claim 1, further comprising following step (d) and prior to step (e), replacing the sample with a presumed identical sample.

9. A method of magnetic resonance measurement of a sample comprising the steps of:
    (a) applying a pulse sequence for a $T_1$-$T_2$* measurement to the sample;
    (b) following a selected recovery time τ, acquiring a free induction decay (FID), and sampling the FID at discrete time intervals to yield signal amplitude measurements;
    (c) allowing for recovery of the sample to equilibrium and then repeating, a finite number of times, steps (a) and (b) with another selected recovery time τ in step (b); and
    (d) processing the signal amplitude measurements for use in determining structure or components of the sample.

10. The method of claim 9, wherein step (a) further comprises inverting the magnetization, and at the commencement of time τ, applying a series of low flip angle RF pulses, and wherein step (b) is carried out after each of the low flip angle RF pulses.

11. The method of claim 10, wherein processing the signal amplitude measurements comprises inverting the signal amplitude measurements comprising performance of a two-dimensional inverse Laplace transform to obtain signal intensity as a function of $T_1$ and $T_2$*, determining structure or components of the sample based on an analysis of the signal intensity.

12. The method of claim 9,
    wherein step (a) further comprises applying an inversion pulse to the sample resulting in Mz=−Mo at the commencement of time τ, and
    wherein step (b) further comprises allowing Mz inverted to recover through zero to a positive value as a function of variable τ, and generating a transverse magnetization prior to acquiring the FID and the sampling steps.

13. The method of claim 12, further comprising inverting the signal amplitude measurements comprising performance of a two-dimensional inverse Laplace transform to obtain signal intensity as a function of $T_1$ and $T_2$*, determining structure or components of the sample based on an analysis of the signal intensity.

14. The method of claim 13, wherein the step of generating a transverse magnetization comprises applying a 90 degree RF pulse for rotating the instantaneous Mz into the transverse plane.

15. The method of claim 13, wherein the step of generating a transverse magnetization comprises applying a low flip angle pulse for rotating the instantaneous Mz into the transverse plane.

16. The method of claim 9, wherein the step of generating a transverse magnetization comprises applying a 90 degree RF pulse, and the method further comprising applying a spin locking RF pulse for a time τ to spin lock the transverse magnetization.

17. The method of claim 16, further comprising inverting the signal amplitude measurements comprising performance of a two-dimensional inverse Laplace transform to obtain signal intensity as a function of $T_{1\rho}$ and $T_2^*$, determining structure or components of the sample based on an analysis of the signal intensity.

* * * * *